(12) United States Patent
Hardee

(10) Patent No.: US 6,643,160 B2
(45) Date of Patent: Nov. 4, 2003

(54) DATA BUS ARCHITECTURE FOR INTEGRATED CIRCUIT DEVICES HAVING EMBEDDED DYNAMIC RANDOM ACCESS MEMORY (DRAM) WITH A LARGE ASPECT RATIO PROVIDING REDUCED CAPACITANCE AND POWER REQUIREMENTS

(75) Inventor: Kim Carver Hardee, Co. Springs, CO (US)

(73) Assignees: United Memories, Inc., Colorado Springs, CO (US); Sony Corporation, Tokyo (JP)

(*) Notice: Subject to any disclaimer, the term of this patent is extended or adjusted under 35 U.S.C. 154(b) by 0 days.

(21) Appl. No.: 10/230,239

(22) Filed: Aug. 28, 2002

(65) Prior Publication Data

US 2003/0022476 A1 Jan. 30, 2003

Related U.S. Application Data

(62) Division of application No. 09/651,938, filed on Aug. 31, 2000, now Pat. No. 6,458,644.

(51) Int. Cl.[7] .................................................. G11C 5/06
(52) U.S. Cl. ........................................... 365/63; 365/59
(58) Field of Search ....................................... 365/63, 59

(56) References Cited

U.S. PATENT DOCUMENTS

| | | | |
|---|---|---|---|
| 5,388,073 A | | 2/1995 | Usami et al. |
| 5,440,516 A | | 8/1995 | Slemmer |
| 5,604,365 A | * | 2/1997 | Kajigaya et al. ............ 257/296 |
| 5,973,953 A | * | 10/1999 | Yamashita et al. ........... 365/63 |
| 5,991,224 A | | 11/1999 | Aipperspach et al. |
| 5,998,251 A | | 12/1999 | Wu et al. |
| 6,345,010 B1 | * | 2/2002 | Shimazaki et al. ..... 365/230.03 |
| 6,392,942 B2 | * | 5/2002 | Noda et al. ................. 365/205 |
| 6,522,565 B2 | * | 2/2003 | Shimazaki et al. ........... 365/63 |

* cited by examiner

Primary Examiner—Richard Elms
Assistant Examiner—Tuan T Nguyen
(74) Attorney, Agent, or Firm—William J. Kubida; Peter J. Meza; Hogan & Hartson LLP

(57) ABSTRACT

A data bus architecture for integrated circuit embedded dynamic random access memory having a large aspect ratio serves to reduce power requirements in the data path through the use of multiple metal layers to reduce capacitance on the data busses. The memory is divided into multiple sections with data bussing in those sections routed in one metal, or conductive, layer. A different metal layer is used to route global data across these sections to a data register located on one edge of the memory. These global data lines are double data rate and single-ended which increases the physical spacing of these lines thereby reducing capacitance and power requirements. Each of the global data lines are routed to only one of the memory sections. This results in the average length of these lines being less than the length of the entire memory, which reduces the capacitance of the lines.

10 Claims, 6 Drawing Sheets

US 6,643,160 B2

DATA BUS ARCHITECTURE FOR INTEGRATED CIRCUIT DEVICES HAVING EMBEDDED DYNAMIC RANDOM ACCESS MEMORY (DRAM) WITH A LARGE ASPECT RATIO PROVIDING REDUCED CAPACITANCE AND POWER REQUIREMENTS

CROSS REFERENCE TO RELATED PATENT APPLICATIONS

The present application is a divisional of U.S. patent application Ser. No. 09/651,938 filed Aug. 31, 2000, now U.S. Pat. No. 6,458,644, which is incorporated herein by reference in its entirety and which is assigned to the assignee of the present application.

BACKGROUND OF THE INVENTION

The present invention relates, in general, to the field of integrated circuit devices. More particularly, the present invention relates to a data bus architecture for integrated circuit embedded dynamic random access memory ("DRAM") having a large aspect ratio (length to width ratio) which serves to reduce power requirements in the data path through the use of multiple metal layers to reduce capacitance on the data busses.

High density embedded DRAM is often required to be integrated on-chip with other integrated circuit devices and circuits. In certain applications, the aspect ratio of the embedded DRAM (or macro) must be relatively large. That is, it must be long and narrow to be properly integrated on the device substrate. In applications where a relatively large amount of fast access time DRAM is required, such as a graphics IC, a comparatively large number of such macros must be placed on-chip. Moreover, depending upon the particular application, all of the embedded DRAM's input/output ("I/O") terminals (as well as other control inputs) may need to be located along the narrow width of the macro. Utilizing conventional layout techniques, these architectural requirements are extremely difficult to achieve given the resulting long signal lines required. This is particularly the case when the constraints of high speed operation and low power supply requirements are imposed.

SUMMARY OF THE INVENTION

The data bus architecture disclosed herein is particularly advantageous for use in addressing data bussing problems inherent in integrated circuit devices having embedded DRAM with a large aspect ratio and requiring a relatively large number of input/outputs ("I/Os") to be located along one narrow side of the memory. In accordance with the disclosure herein, the memory is divided into multiple sections with data bussing in those sections routed in one metal, or conductive, layer. A different metal layer is used to route global data across these sections to a data register located on one edge of the memory. These global data lines are double data rate ("DDR") and single-ended (as opposed to differential-ended) which increases the physical spacing of these lines thereby reducing capacitance and power requirements. Moreover, each of the global data lines are routed to only one of the memory sections. This results in the average length of these lines being less than the length of the entire memory which further serves to reduce the capacitance of the lines.

Particularly disclosed herein is an integrated circuit device incorporating an embedded memory which comprises a plurality of memory arrays disposed substantially linearly about a common axis and a like plurality of memory array data registers, each of the memory array data registers coupled to, and associated with, one of the plurality of memory arrays and disposed adjacent a first edge thereof substantially perpendicularly about the common axis. A common data register is disposed substantially perpendicularly about the common axis and is coupled to the plurality of memory array data registers by a plurality of global data lines. A first subset of the plurality of global data lines extends only to an adjacent one of the plurality of memory arrays and a second subset extends over the adjacent memory array to a nextmost adjacent one of the plurality of memory arrays. A third subset further extends over the adjacent and nextmost adjacent one or the memory arrays to another memory array.

Also disclosed herein is a method for reducing data line capacitance in an integrated circuit device having a plurality of conductive layers formed therein and incorporating a memory array having a plurality of word lines (or word line shunts), data lines and global data lines coupled to the data lines. The method comprises forming the word lines in an $n^{th}$ layer of the plurality of conductive layers and forming the data lines in an $(n+2)^{th}$ layer of the plurality of conductive layers and forming the global data lines in the $(n+4)^{th}$ layer of the plurality of conductive layers.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

DESCRIPTION OF A REPRESENTATIVE EMBODIMENT

Figure 1:
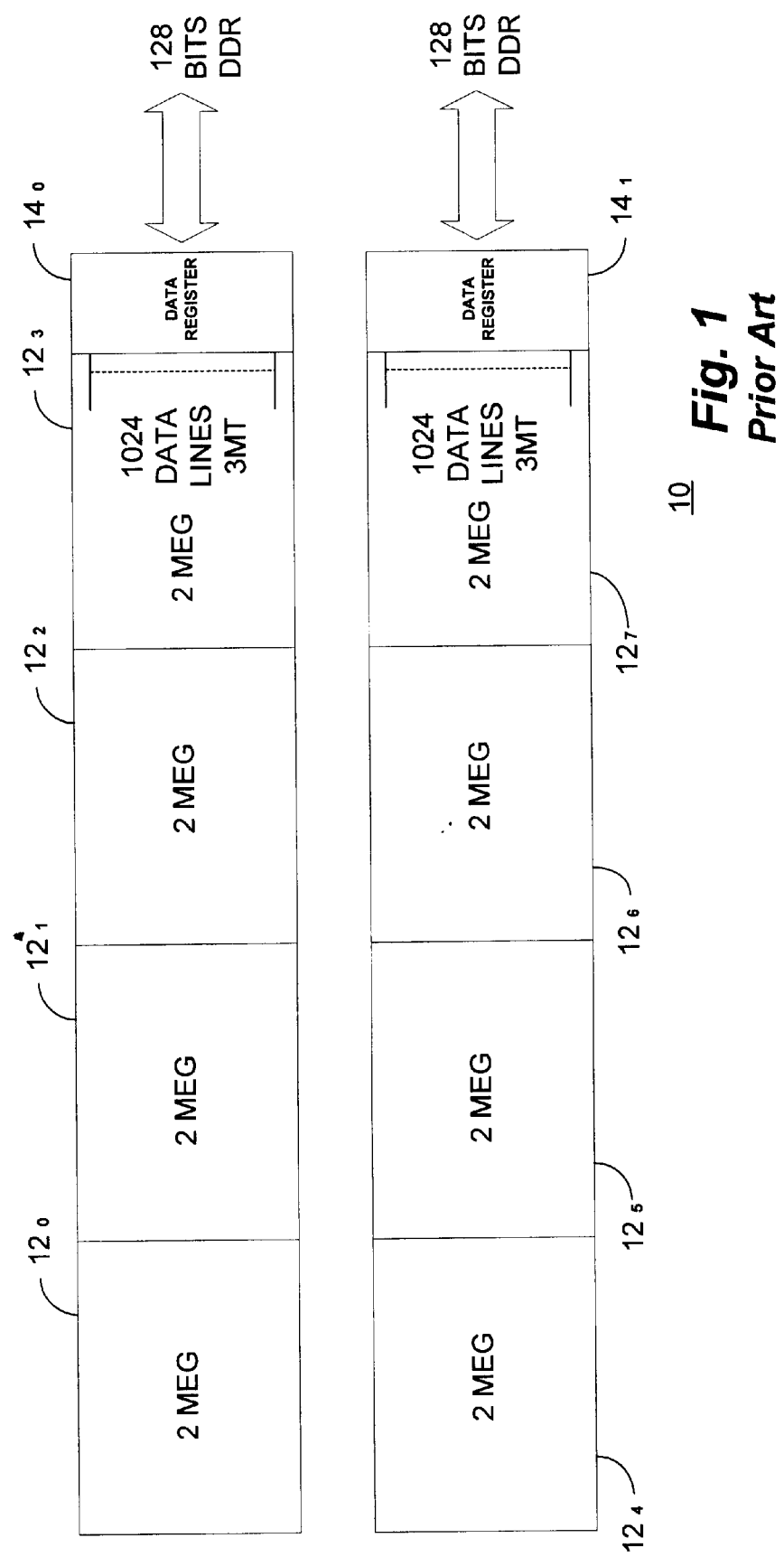
FIG. 1 is a simplified architectural overview of a conventional 16MEG embedded DRAM macro derived from a 4MEG design having a relatively large aspect ratio (length to width)

With reference now to FIG. 1, a simplified architectural overview of a conventional 16MEG embedded DRAM macro 10 derived from a 4MEG design is shown. As illustrated, the macro 10 has a relatively large aspect ratio (length to width) and comprises two rows of four 2MEG memory arrays $12_0$ through $12_7$, each of the rows coupled to 1024 data lines formed in a third metal layer ("3MT"). Each row is coupled to a respective data register $14_0$ and $14_1$ and outputs 128 bits of double data rate ("DDR") data. The third metal layer data lines include the complementary data write ("DW") and data write "bar" ("DWB") lines as well the data read ("DR") and data read "bar" ("DRB") lines. In a particular embodiment, the macro 10 data lines would have a width of substantially 0.26 μm on a spacing of 0.58 μm with a relatively long length of 7400 μm. The total number of data lines is 2×1024=2048 and the number of lines being switched per cycle is 1024. This method results in very high power requirements due to the large number of data lines with high capacitance switching at the same time.

Figure 2:
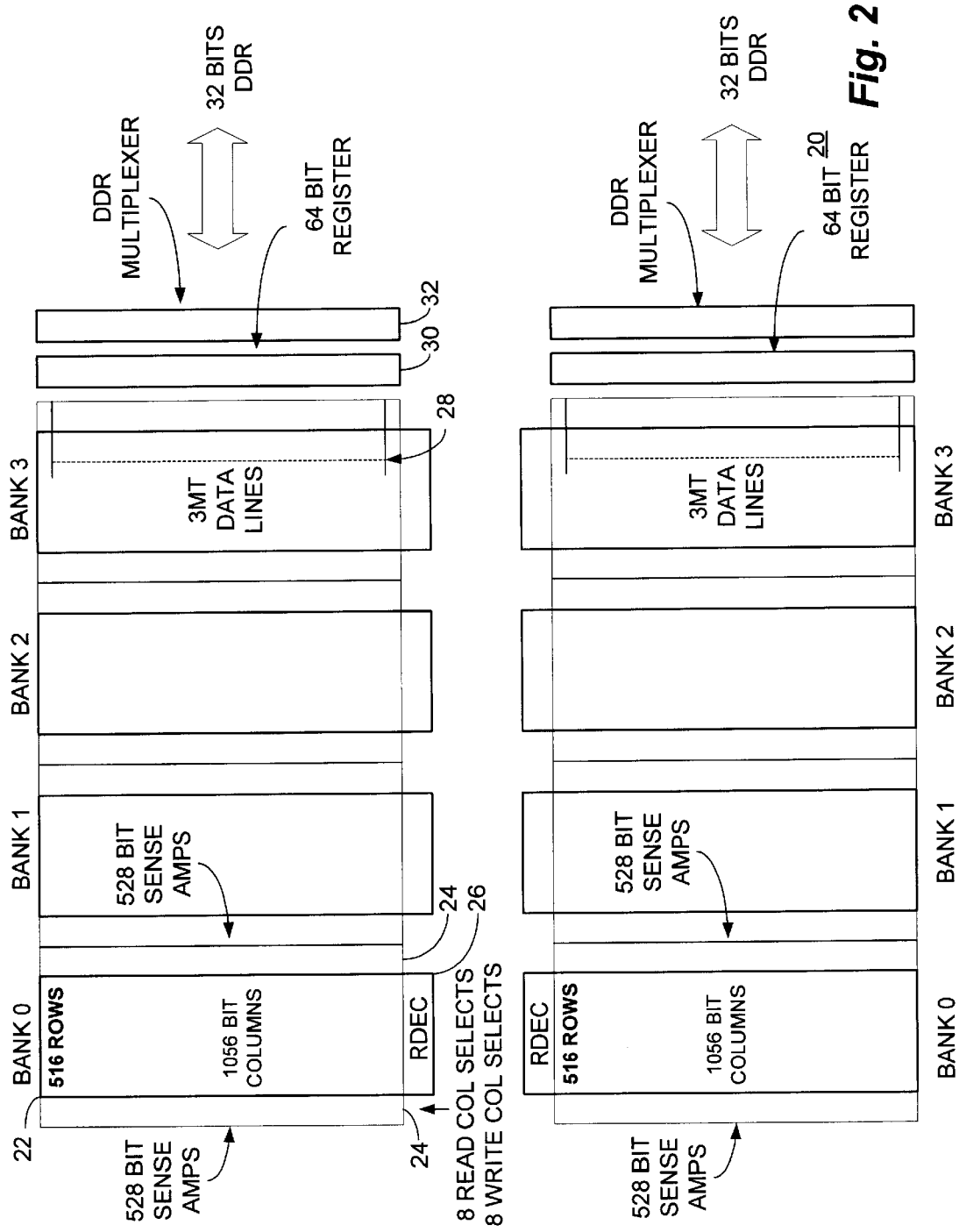
FIG. 2 is a simplified architectural overview of a 4MEG DRAM array for use in conjunction with a 16MEG macro in accordance with an embodiment of the present invention.

With reference additionally now to FIG. 2, a simplified architectural overview of a 4MEG DRAM array 20 for use in conjunction with a 16MEG macro in accordance with an embodiment of the present invention is shown. The array 20 comprises two rows of four memory banks 22 (Bank 0 through Bank 3 inclusive), each comprising 1056 bit columns by 516 rows. Dual 528 bit sense amplifiers 24 are associated with each of the memory banks 22 as well as a row decoder ("RDEC") 26 together providing eight read column selects and 8 write column selects. Each row of memory banks 22 is coupled to third metallization data lines as will be more fully described hereinafter and input/output ("I/O") of 32 bits DDR is provided through a 64 bit register 30 and DDR multiplexer 32.

In accordance with the present invention, the architecture disclosed comprises four 4MEG blocks placed side by side. Each 4MEG block consists of two 2MEG blocks. The structure of each 4MEG block is shown in this figure. The DDR multiplexer 32 connects 128 bit of single data rate ("SDR") data to 64 bits of DDR data. The data lines which run horizontally across each 2MEG block are formed in metallization layer 3.

Figure 3:
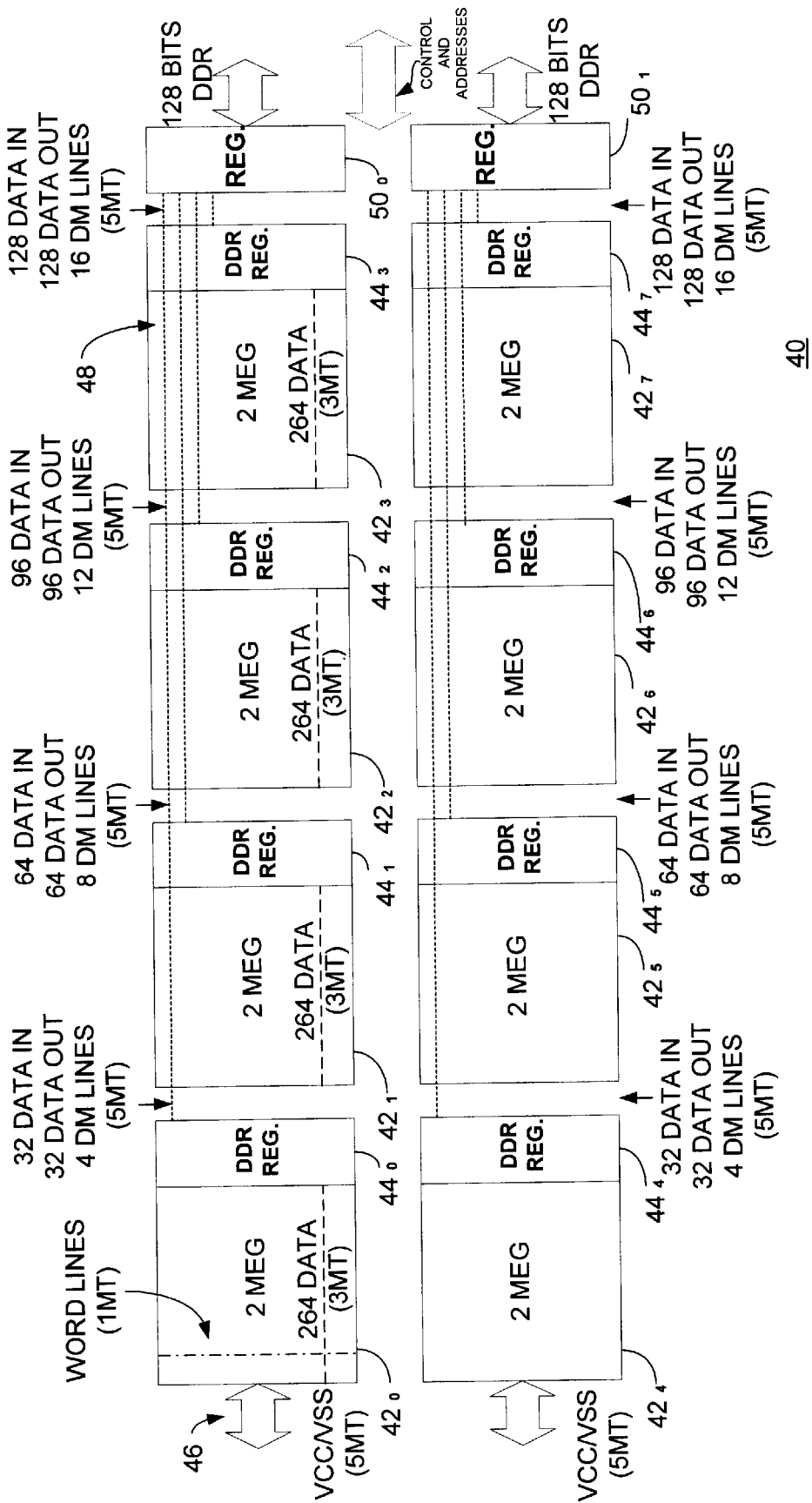
FIG. 3 is a simplified architectural overview of a 16MEG DRAM macro in accordance with the present invention utilizing the 4MEG DRAM array of the preceding figure.

With reference additionally now to FIG. 3, a simplified architectural overview of a 16MEG DRAM macro 40 in accordance with the present invention is shown utilizing four of the 4MEG DRAM arrays 20 of the preceding figure. The macro 40 comprises eight 2MEG arrays $42_0$ through $42_7$, each associated with a DDR register $44_0$ through $44_7$ respectively. VCC and VSS voltage lines 46 coupled to each of the arrays 42 is formed in the fifth metal layer as indicated. Data lines 48 are also formed in the fifth metal layer and extend between one of a pair of registers $50_0$ and $50_1$ associated with each row of the arrays 42 and extend only as far as needed such that, for example, the data lines 48 to array $42_0$ are longer than those to array $42_1$ which, in turn, are longer than those to array $42_2$ and $42_3$ as shown. The registers 50 each couple the associated arrays 42 to a 128 bit DDR data and control busses.

The macro 40 architecture increases the bit density to 16MEG and increases the I/O width to 256 over the macro 10 of FIG. 1. Further, the I/O's are now DDR as opposed to single data rate ("SDR") with a target clock speed of 500 MHz. As discussed previously, the most difficult aspect of such a design is the required aspect ratio of the macro in that it was required to be relatively long and narrow such that as many as 16 of the macros 40 could be placed on an integrated circuit graphics chip. Further, all of the I/O's and other inputs had to be located on one narrow side of the macro 40.

These requirements made it very difficult to achieve both high speed and low power due to what would conventionally be relatively long signal lines as shown in the macro 10 of FIG. 1. The architecture 40 provides optimized signal routing and power bussing over that of such conventional designs.

Each 2MEG block, comprising an array 42, has a DDR register 44 (or macro) which has 32 data in and 32 data out at DDR (double data rate). The data in lines are routed from an 8MEG register 50 on the right side of the macro to each 2MEG block in the 5th metal layer. These lines are called global data write ("GDW") lines. Each 8MEG register 50 includes input buffers for 128 data ("D") inputs and 16 data mask ("DM") inputs.

The data out lines from each 2MEG block are routed in the 5th metal layer to the 8MEG registers 50. These registers 50 include latches and output buffers to provide 128 outputs ("Q") and 1 QS (output data strobe) output. The 5th metallization layer data out lines are called global data read bar ("GDRB") lines. The VCC and VSS lines are also routed horizontally in the fifth metallization layer.

Figure 4:
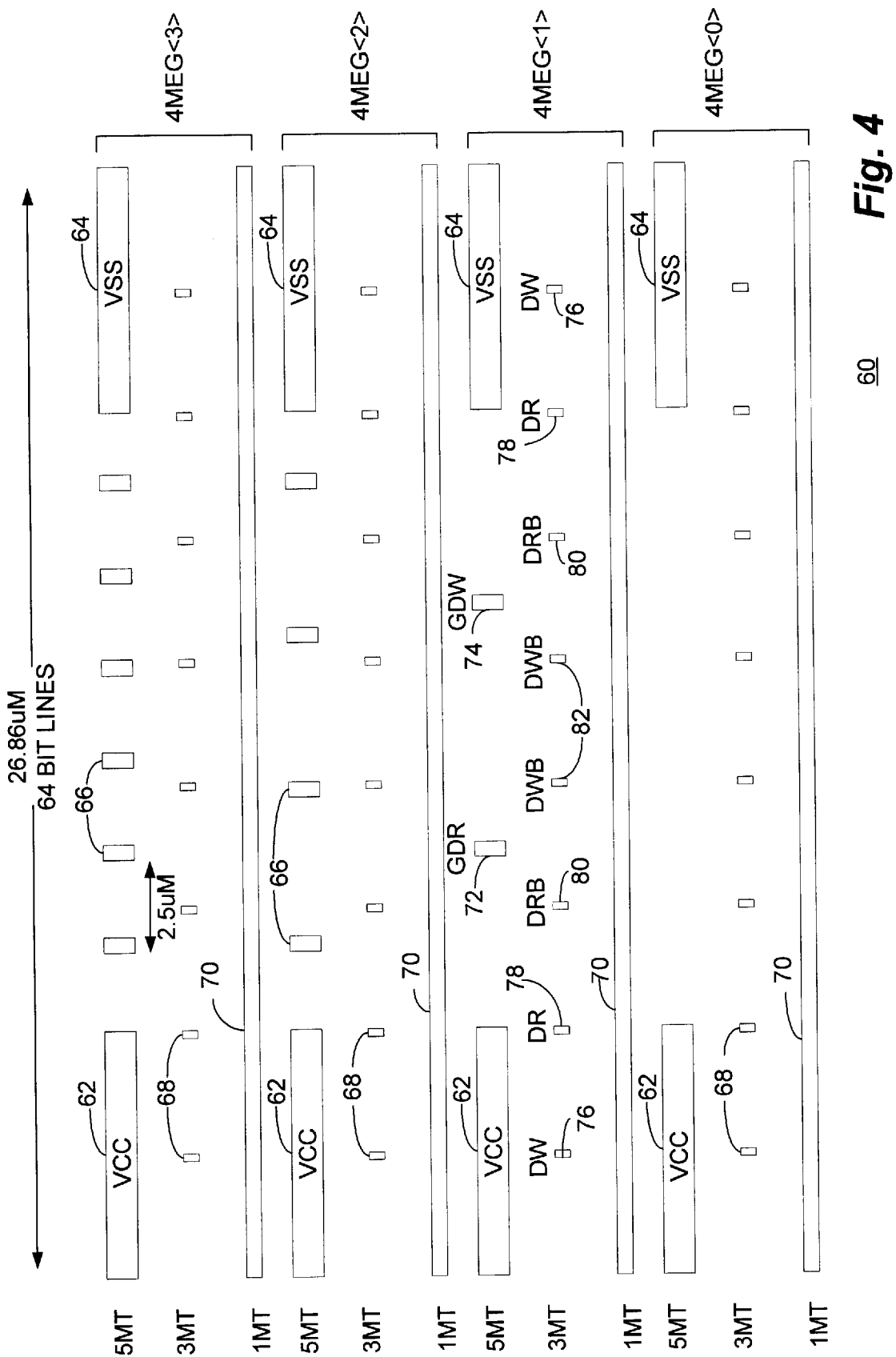
FIG. 4 is a simplified cross-sectional view of the macro of FIG. 3 illustrating the use of the first, third and fifth metallization layers for the global word lines (or word line shunts), complementary data write ("DW" and "DWB") and data read lines ("DR" and "DRB") and the global data read ("GDR") and global data write ("GDW") lines respectively as well as the supply voltage ("VCC") and reference voltage ("VSS") lines.

With reference additionally now to FIG. 4, a simplified cross-sectional view of the macro 40 of FIG. 3 is shown illustrating each of the 4MEG memory arrays of Bank 0 ("4MEG<0>") through Bank 4 ("4MEG<3>") thereof. The VCC and VSS voltage lines are formed in the fifth metallization layer for each of the banks as well as the data in and data out lines 66 as shown, which in the exemplary embodiment shown, are on a pitch of substantially 2.5 μm in bank 3. A number of data lines 68 are formed in the third metallization layer as shown and can include the DW lines 76, DR lines 78, DRB lines 80 and DWB lines 82 in bank 1. The global word lines 70 (or word line shunts) are formed in the first metallization layer as illustrated.

Referring back to FIG. 3 as well, it can be seen that one fourth of the GDW and GDRB lines run from the 8MEG register 50 to the leftmost 2MEG block, another one fourth run to the next 2MEG block, yet another one fourth run to the next 2MEG block and the final one fourth run to the rightmost 2MEG block. This technique reduces the total capacitance on the GDW and GDRB lines and, therefore, reduces the necessary operating power. Also, as the GDW and GDRB lines drop off from right to left, the spacing of the remaining lines can be increased, which further reduces capacitance and power as the latter is proportional to $Cv^2f$, where C is capacitance, v is voltage and f is frequency.

Figure 5:
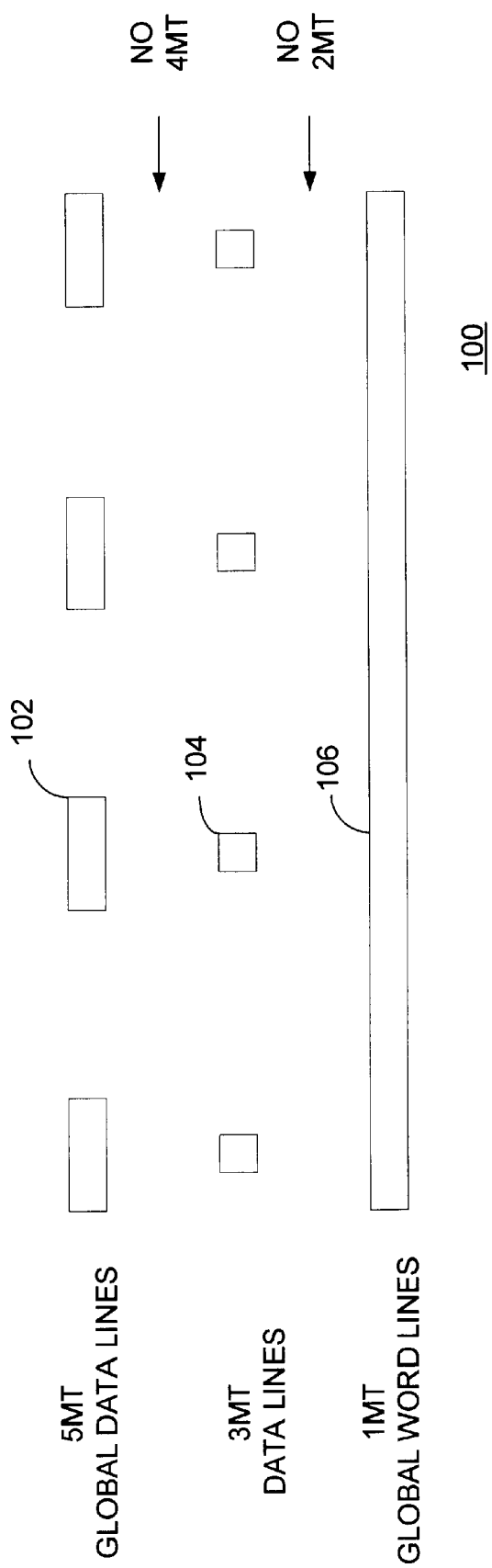
FIG. 5 is a simplified cross-sectional view of conceptual memory macro in accordance with the present invention wherein the global word lines are formed in the first metal layer, the data lines are formed in the third metal layer and the global data lines are formed in the fifth metal layer with the second and third metal layers being omitted in the interstices between the enumerated signal lines in order to reduce capacitance and concomitant power requirements.

With reference additionally to FIG. 5, a simplified cross-sectional view of conceptual memory macro 100 in accordance with the present invention is shown. In this example, the global word lines 106 may be formed in the first metal layer, the data lines 104 may be formed in the third metal layer and the global data lines 102 may be formed in the fifth metal layer with the second and third metal layers being omitted in the interstices between the enumerated signal lines in order to reduce capacitance and concomitant power requirements.

Figure 6:
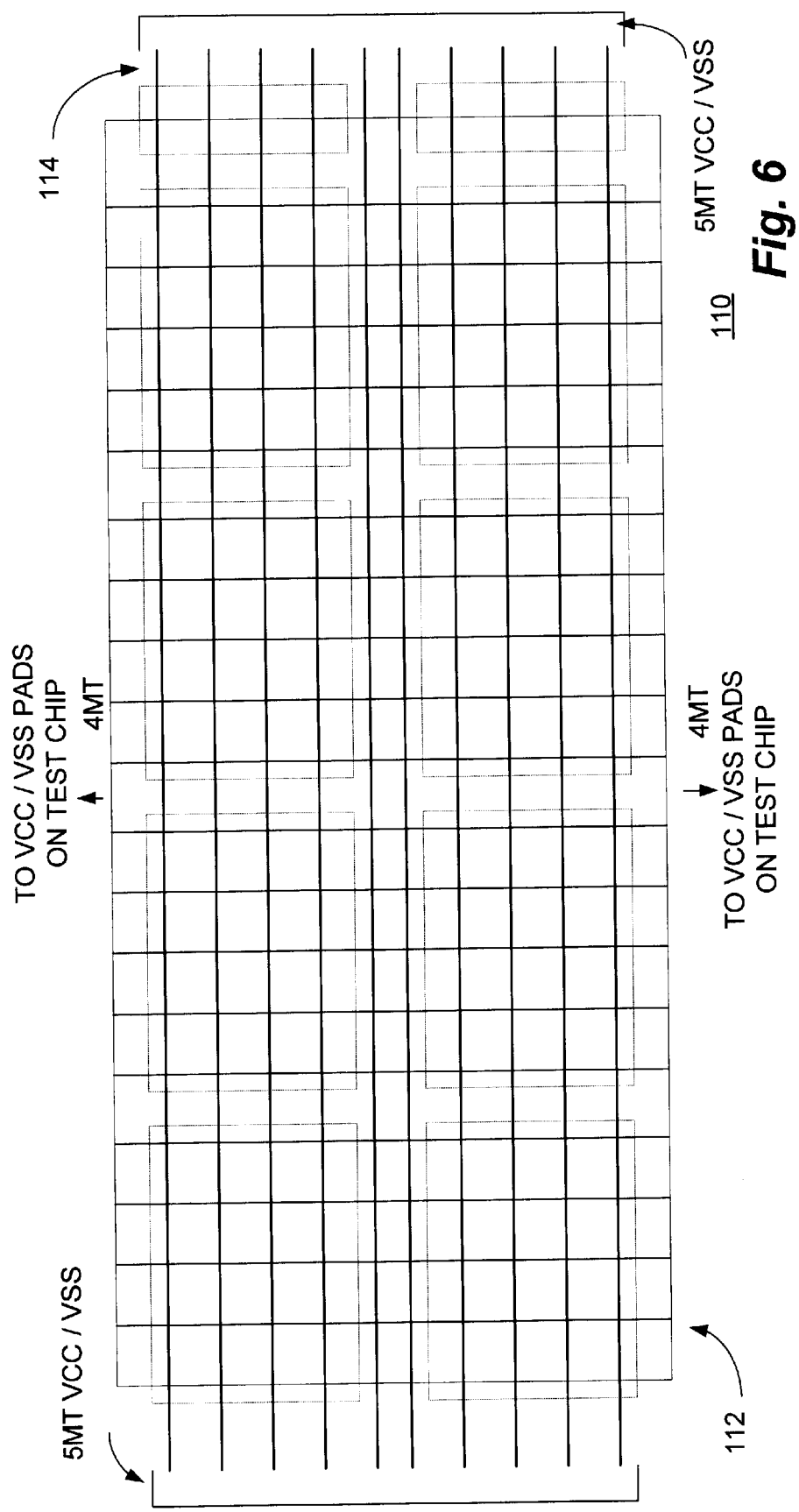
FIG. 6 is a simplified partially cut-away view of the VCC and VSS power bussing showing a portion of the fourth and fifth metallization layers of a macro in accordance with the present invention.

With reference additionally now to FIG. 6, FIG. 6 is a simplified partially cut-away view of the VCC and VSS power bussing 110 is shown illustrating a portion of the fourth and fifth metallization layers 112, 114 of a macro as previously described in accordance with the present invention. The fourth metal layer 112 runs vertically through the macro at spaced intervals for VCC and VSS bussing and is connected to the horizontal 5th metal layer 114 VCC and VSS lines. The capacitance on the 5th metal GDW and GDRB lines is further reduced because there is not much 4th metal under these lines. This also reduces the capacitance on the 3rd metal horizontal data lines in each 2MEG block.

What has been provided, therefore, is an architecture wherein the read and write data paths have been designed for lower power and higher speed operation. In order to achieve this low power operation, several important constraints must be met including fewer signal lines transitioning, lower capacitance on the signal lines as well as reduced voltage swings. For purposes of comparison, the conventional macro 10 (FIG. 1) required approximately 3.1 Watts of power. By implementation of the techniques disclosed herein including the data lines for each 2MEG block being formed in the third metal layer, the I/O lines from the 2MEG arrays to the I/O register only extending as far as necessary and no second or fourth metallization layers over the array results in much lower data path capacitance. Combined with the VCC and VSS bussing in the fifth metal layer, the estimated power required for the macro 40 (FIG. 3) is reduced to substantially 1.9 Watts. When combined with data line power reduction in the third metal layer, this could be further reduced to about 1.7 Watts or less.

While there have been described above the principles of the present invention in conjunction with specific architecture and metallization layers, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The applicants hereby reserve the right to formulate new claims to such features and/or combinations of such features during the prosecution of the present application or of any further application derived therefrom.

What is claimed is:

1. A method for reducing data line capacitance in an integrated circuit device having a plurality of conductive layers formed therein and incorporating a memory array having a plurality of word lines, data lines and global data lines coupled to said data lines, said method comprising:

forming said word lines in an $n^{th}$ layer of said plurality of conductive layers;

forming said data lines in an $(n+2)^{th}$ layer of said plurality of conductive layers; and forming said global data lines in an $(n+4)^{th}$ layer of said plurality of conductive layers.

2. The method of claim 1 further comprising:

forming at least one supply voltage connection to said integrated circuit device in said $(n+4)^{th}$ layer of said plurality of conductive layers.

3. The method of claim 2 further comprising:

forming another supply voltage connection to said integrated circuit device in said $(n+4)^{th}$ layer of said plurality of conductive layers.

4. The method of claim 2 in which said forming at least one supply voltage connection to said integrated circuit device comprises forming a VCC supply voltage connection.

5. The method of claim 3 in which said forming another supply voltage connection to said integrated circuit device comprises forming a VSS supply voltage connection.

6. An integrated circuit device having a plurality of conductive layers and incorporating a memory array comprising:

a plurality of word lines coupled to said memory array formed in an $n^{th}$ layer of said plurality of conductive layers;

a plurality of data lines coupled to said memory array formed in an $(n+2)^{th}$ layer of said plurality of conductive layers; and a plurality of global data lines coupled to said plurality of data lines formed in an $(n+4)^{th}$ layer of said plurality of conductive layers.

7. The integrated circuit of claim 6 further comprising at least one supply voltage connection in said $(n+4)^{th}$ layer of said plurality of conductive layers.

8. The integrated circuit of claim 7 in which the supply voltage connection comprises a VCC supply voltage connection.

9. The integrated circuit of claim 7 further comprising another supply voltage connection in said $(n+4)^{th}$ layer of said plurality of conductive layers.

10. The integrated circuit of claim 9 in which the another supply voltage connection comprises a VSS supply voltage connection.

* * * * *